United States Patent [19]
McGregor

[11] Patent Number: 4,567,439
[45] Date of Patent: Jan. 28, 1986

[54] APPARATUS FOR MEASURING THE MAGNITUDE OF A MAGNETIC FIELD

[75] Inventor: Douglas D. McGregor, Plano, Tex.

[73] Assignee: Texas Instruments Incorporated, Dallas, Tex.

[21] Appl. No.: 535,200

[22] Filed: Sep. 23, 1983

[51] Int. Cl.$^4$ ............................................. G01R 33/08
[52] U.S. Cl. ..................................... 324/304; 324/301
[58] Field of Search ................ 324/301, 302, 304, 305

[56] References Cited

U.S. PATENT DOCUMENTS 3,380,632  10/1967  Robinson ............................ 324/304
3,728,612   4/1973  Hearn .................................. 324/304

Primary Examiner—Michael J. Tokar
Attorney, Agent, or Firm—Alva H. Bandy; Leo N. Heiting; Melvin Sharp

[57] ABSTRACT

An apparatus for measuring the magnitude of a magnetic field in one embodiment includes a $^3$He cell having an oscillator connected thereto for producing an electrical discharge for metastable $^3$He atoms, a $^4$He lamp having an oscillator connected thereto for producing $^4$He radiation and an optical path to the $^3$He cell including a lens for collimating the $^4$He radiation and a circular polarizer. The imaged $^3$He atoms and $^4$He radiation interact to magnetize a portion of the $^3$He atoms in a direction parallel to the direction of the ambient magnetic field. After the cell magnetization, an oscillatory magnetic field normal to the ambient field is established by coils connected to a frequency synthesizer which is scanned over a frequency interval including the free precession (Larmor) frequency. This action rotates the direction of magnetization of the $^3$He cell atoms from parallel to the ambient magnetic field to approximately perpendicular to the ambient magnetic field. The cell then is allowed to precess freely and an a.c. is induced in a coil during precession. The a.c. is connected to a frequency discriminator which may be a digital type to digitize the voltage representative of the frequency of the a.c. A very narrow band digital filter filters the digitized output of the discriminator and a digital to analog converter produces a voltage from the digital filter output for a charge recorder for charting.

7 Claims, 1 Drawing Figure

APPARATUS FOR MEASURING THE MAGNITUDE OF A MAGNETIC FIELD

BACKGROUND OF THE INVENTION

This invention relates to magnetometers and more particularly to a Helium free precession magnetometer.

A $^3$He free precession magnetometer operates in three stages. In the first stage, the pumping stage, a glass cell containing low pressure $^3$He gas (1 to 10 Torr) is excited with an electric discharge and radiation from a $^4$He lamp is directed through the cell. The interaction of the $^4$He light and the $^3$He atoms tends to magnetize the $^3$He atoms in a direction parallel to the direction of the ambient magnetic field. In the second stage, the nuclear magnetization of the cell is rotated and in the third stage, the cell magnetization freely precesses for several hours.

In the past, rotation of the nuclear magnetization of the cell of $^3$He gas was accomplished, after the establishment of the cell magnetization along the direction of the ambient field ($H_o$), by applying a magnetic bias field $H_B$ to the cell in opposition to the earth's field. The field is applied slowly so that the magnetization can follow the resultant field adiabatically to a direction making an angle with the field ($H_o$). Then the bias field is rapidly (non-adiabatically) removed so that the magnetization remains instantaneously in position and begins to precess around the field ($H_o$). A more detailed discussion of this technique is set forth in an article by R. E. Slocum and B. I. Marton, "A Nuclear Free Precession Magnetometer Using Optically Polarized $^3$He Gas", IEEE Trans. Magnetics, MAG-10 (1974).

Several problems have been found to exist with the prior art devices. First, a bias field strength of the order of one Gauss is required. In order to produce a one Gauss field of sufficient uniformity, a coil with dimensions may times larger than the cell dimensions is necessary as well as some knowledge about the earth's field direction in order to make the device work. Secondly, circuitry of some complexity is required to extinguish the bias field quickly.

SUMMARY OF THE INVENTION

Accordingly, it is an object of this invention to reduce substantially the required bias field strength and drive current.

Another object of the invention is to provide a magnetometer which is compact in size, simple to construct and economical to produce.

Still another object of the invention is to provide a magnetometer which is insensitive to the direction of the rotation coils in relation to the ambient field ($H_o$).

Yet another object of the invention is to provide a magnetometer which does not require knowledge of the ambient magnetic field intensity.

Briefly stated, the invention comprises an electronic means for rotating by approximately 90 degrees to the ambient field ($H_o$) the direction of the magnetization of a $^3$He cell of a $^3$He free precession magnetometer for sensing during free precession the ambient magnetic field.

The above objects and features of the invention will become more readily understood in the following detailed description taken in conjunction with the drawing.

BRIEF DESCRIPTION OF THE DRAWING

The drawing is a schematic drawing, partly in block form, of the magnetometer.

DESCRIPTION OF THE PREFERRED EMBODIMENTS

Figure 1:
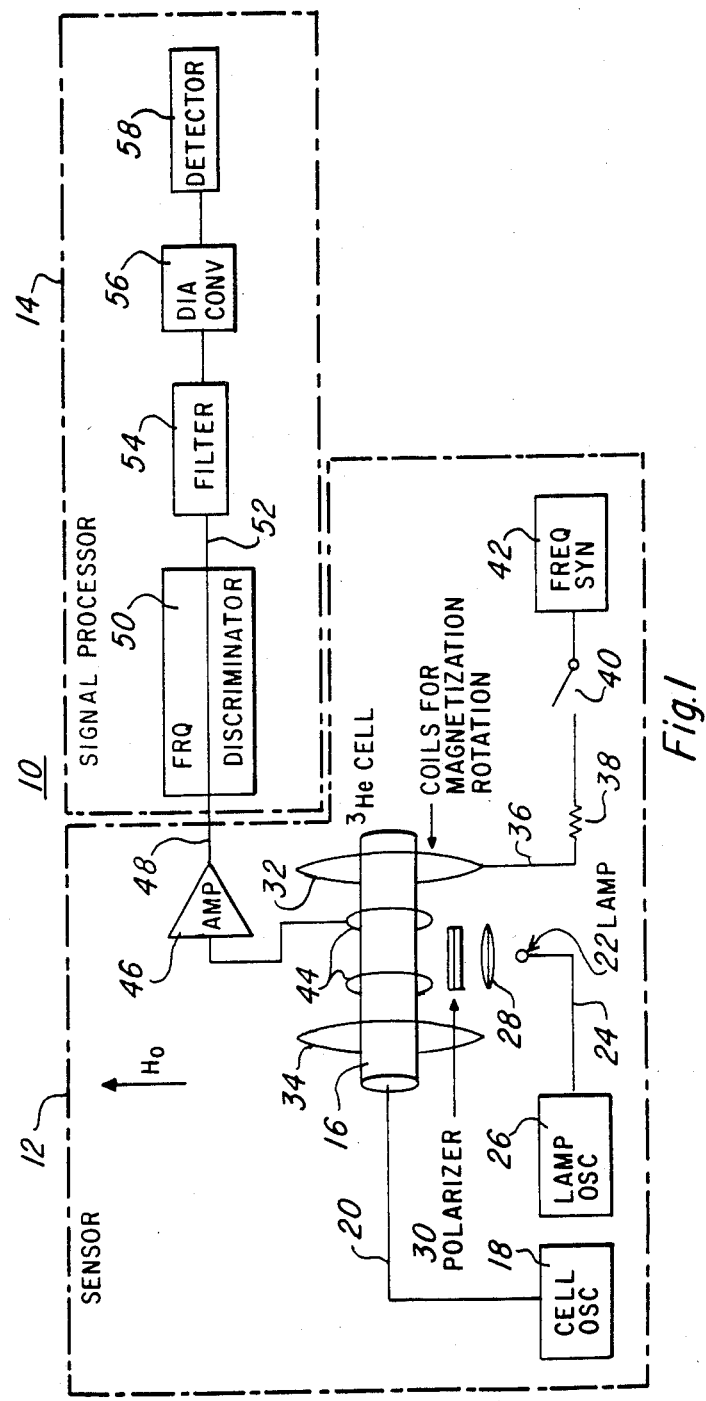

Referring now to the drawing, the magnetometer 10 comprises a sensor means 12 and a signal processor means 14. The sensor means comprises a cylindrical glass (Pyrex) cell 16 containing a working substance such as, for example, a low pressure (1 to 10 Torr) $^3$He gas. A cell oscillator 18 which may be, for example, a 50 MHz or 100 KHz oscillator manufactured by Texas Instruments Incorporated is connected by lead 20 to the cell 16. The $^3$He gas is excited to a metastable state by an electric discharge generated in cell 16 by the 100 KHz oscillator output.

A $^4$He lamp 22 is connected by lead 24 to a lamp oscillator 26. Lamp oscillator 26 is a 50 MHz oscillator manufactured by Texas Instruments Incorporated. Radiation generated by an electric discharge in the lamp 22 in response to the output of the lamp oscillator 26 is collimated by a Fresnel lens 28 and circularly polarized by a polarizer 30. The polarized radiation is directed through the cell 16 where it interacts with the metastable $^3$He atoms to magnetize the $^3$He atoms in a direction parallel to the direction of the ambient magnetic field ($H_o$).

After the cell magnetization has been established parallel to the earth's field direction and the electric discharges of the lamp and cell extinguished, an oscillatory magnetic field is established normal (90°) to the direction of the ambient magnetic field ($H_o$) by Coils 32, and 34. The coils 32 and 34 may be, for example, two 5-inch diameter coils in a Helmholtz arrangement connected by lead 36 to one end of a load limiting resistor 38 which has its other end connected to switch 40. The switch 40 is connected to a scanning frequency synthesizer 42. The scanning frequency synthesizer scans through a frequency range containing the $^3$He free precession frequency (e.g. 1622 Hz for $H_o = 0.5$ G). The scanning frequency synthesizer 42 is manufactured and sold by Hewlett Packard. When switch 40 is closed, scanning frequency synthesizer is used to drive the coils 32 and 34.

If $H_1(t)$ is the value of the oscillatory field as a function of time (t), then $H_1(t)$ is:

$$H_1(t) = H_{10} \cos(\omega_0 t + \tfrac{1}{2}\alpha t^2 + \phi).$$

The initial phase $\phi$ is arbitrary. The instantaneous frequency $\omega_o + \alpha t$ varies between the value $\omega_o$ (at t=o, when the oscillatory field is first turned on) and $\omega_o + \alpha t_1$, where $t_1$ is the duration of the oscillatory field. The frequency interval ($\omega_o$, $\omega_o + \alpha t_1$) is chosen so that it includes the free precession (i.e., Larmor) frequency $\gamma_n H_o$, where $\gamma_n$ is the $^3$He gyromagnetic ratio. Choices of $H_{10}$ and $\alpha$ are made so that the oscillatory magnetic field will rotate the cell magnetization by 90 degrees in order that free precession can take place. This rotation technique is relatively insensitive to the direction of the rotation coils in relation to the ambient field $H_o$; the rotation technique performs adequately as long as the angle between the coil axis and $H_o$ is between 30 degrees and 150 degrees.

The free precession of the cell magnetization in the earth's magnetic field lasts about ten hours. Pickup coils 44 generate an alternating current a.c. induced therein by the magnetic field associated with the rotation of the cell magnetization.

The coils 44 are connected to an amplifier 46 for amplifying the output of the coil to a working level for the signal processor 14.

The amplifier 46 is connected by lead 48 to a frequency discriminator 50. The frequency discriminator 50 may be, for example, either a digital phase locked-loop type discriminator or a frequency counter type discriminator. The frequency discriminator preferably is of the digital phase locked-loop type. The frequency discriminator receives the a.c. output of the coils and produces a digitized voltage output, which is representative of the frequency of the pickup coils. The frequency discriminator 50 is connected by lead 52 to a narrow band digital filter 54 for passing a preselected band of frequencies. Filter 54 is connected to a digital to analog (D/A) converter 56 for changing the digitized output of the filter 54 to an analog voltage. The D/A converter is connected to a signal indicator 58 such as, for example, a chart recorder for indicating any signal changes detected by the filter 54.

It will be appreciated by those persons skilled in the art that this invention can be used with other materials that exhibit a nuclear magnetization or an electron spin magnetization. In particular, the magnetometer could use water as the working substance. Also, other applications of the invention are possible such as, for example, use in the area of nuclear magnetic resonance spectroscopy.

Although preferred embodiments of the invention have been described in detail, it is understood that various changes, substitutions and alterations can be made therein without departing from the scope of the invention as defined by the appended claims.

What is claimed is:

1. Apparatus for rotating nuclear magnetization comprising a cell means containing a longitudinal nuclear magnetized substance, and a moment rotation producing means operatively connected to the cell, said moment rotation producing means including a switch for turning on and off the moment rotation producing means for establishing in the cell during the on time an oscillatory magnetic field in the substance substantially normal to the direction of the ambient field and for free precession during the off time.

2. An apparatus for measuring the magnitude of a magnitude field comprising:
   sensor means for sensing the ambient magnetic field and a signal processing means operatively connected to the sensor means for producing signals representative of changes in the ambient magnetic field, the sensor means including a cell means having a cell containing a nuclear magnetizable substance, a lamp and cell discharge means operatively connected to the cell a time sufficient for establishing a longitudinal magnetization in the substance parallel to the ambient magnetic field, a moment rotation means, including coils and a switch for operatively connecting the moment rotation means to the cell for establishing, during the on time an oscillatory magnetic field in the substance substantially normal to the direction of the ambient field and during the off time for free precession, and a magnetic pickup means for sensing the freely precession magnetization of the cell, whereby the free precession of the cell magnetization in the ambient magnetic field is increased substantially and power consumption substantially reduced.

3. An apparatus according to claim 2 wherein the cell and nuclear magnetizable substance in the cell are, respectively, a glass cell and $^3$He gas under a preselected pressure and the means for establishing the magnetization in the cell comprises an oscillator operatively connected to the glass cell for producing metastable $^3$He atoms, a $^4$He lamp, an oscillator operatively connected to the $^4$He lamp and an optical path from the $^4$He lamp to the cell including a circular polarizer optically connected to the glass cell for producing $^4$He radiation whereby the interaction of the $^4$He light and the $^3$He atoms magnetizes at least a portion of the $^3$He atoms in a direction parallel to the direction of the ambient field.

4. An apparatus according to claim 2 wherein the moment rotation means comprises a plurality of coils circumscribing the cell and a scanning frequency synthesizer operatively connected to the coils whereby the coils are driven by the scanned frequency of the frequency synthesizer through a frequency range containing the $^3$He free precession frequency and rotates the cell magnetization from a direction substantially parallel to the ambient magnetic field into a plane substantially normal thereto.

5. An apparatus according to claim 2 wherein the signal processing means comprises a frequency discriminator for producing a signal corresponding to the output signal of the sensor means, a filter means operatively connected to the frequency discriminator for providing a filtered time signal, and a chart recorder operatively connected to the filter.

6. A method for measuring the magnitude of a magnetic field consisting of the steps of:
   (a) magnetizing the atoms of a nuclear magnetizable substance in a direction substantially parallel to the direction of the ambient magnetic field;
   (b) inducing for a preselected time an oscillatory magnetic field substantially normal to the ambient magnetic field;
   (c) thereafter permitting free precession of the cell magnetization;
   (d) inducing signals representative of the oscillatory magnetic field during free precession; and
   (e) producing an output voltage proportional to the frequency deviation of the induced signals from a reference frequency, whereby the time of the free precession of the cell magnetization in the ambient magnetic field is increased substantially and the power consumption substantially reduced.

7. A method according to claim 6 wherein the step of inducing an oscillatory magnetic field substantially normal to the ambient magnetic field consists of applying a scanning frequency including the free precession frequency of the working substance to an induction coil for rotating the magnetized atoms substantially normal to the direction of the ambient field.

* * * * *